United States Patent [19]

Gebhard

[11] 4,004,222
[45] Jan. 18, 1977

[54] TEST SYSTEM FOR SEMICONDUCTOR MEMORY CELL

[75] Inventor: Richard E. Gebhard, Phoenix, Ariz.

[73] Assignee: SEMI, Phoenix, Ariz.

[22] Filed: Nov. 20, 1974

[21] Appl. No.: 525,381

[52] U.S. Cl. .................... 324/158 R; 235/153 AC
[51] Int. Cl.² ................. G01R 31/00; G01R 31/26
[58] Field of Search ....... 324/158 R, 158 D, 158 T, 324/61 R, 60 C, 73 R; 235/153 AC

[56] References Cited

UNITED STATES PATENTS

| 3,560,849 | 2/1971 | Ryan | 324/158 R |
|---|---|---|---|
| 3,748,579 | 7/1973 | Henry et al. | 324/158 D |
| 3,795,859 | 3/1974 | Benante et al. | 324/158 T |
| 3,859,595 | 1/1975 | Lang | 324/60 C |

OTHER PUBLICATIONS

Sah et al.; "Thermal and Optical..."; Solid State Electronics; vol. 13; June 1970; pp. 759-785.

*Primary Examiner*—R. V. Rolinec
*Assistant Examiner*—Ernest F. Karlsen
*Attorney, Agent, or Firm*—Lindenberg, Freilich, Wasserman, Rosen & Fernandez

[57] ABSTRACT

This invention accelerates the leakage current from certain nodes of memory cells in static semiconductor memory to an extent whereby defective memory cells, which would not be detected without a considerable waiting period elapsing, are readily quickly detected.

6 Claims, 1 Drawing Figure

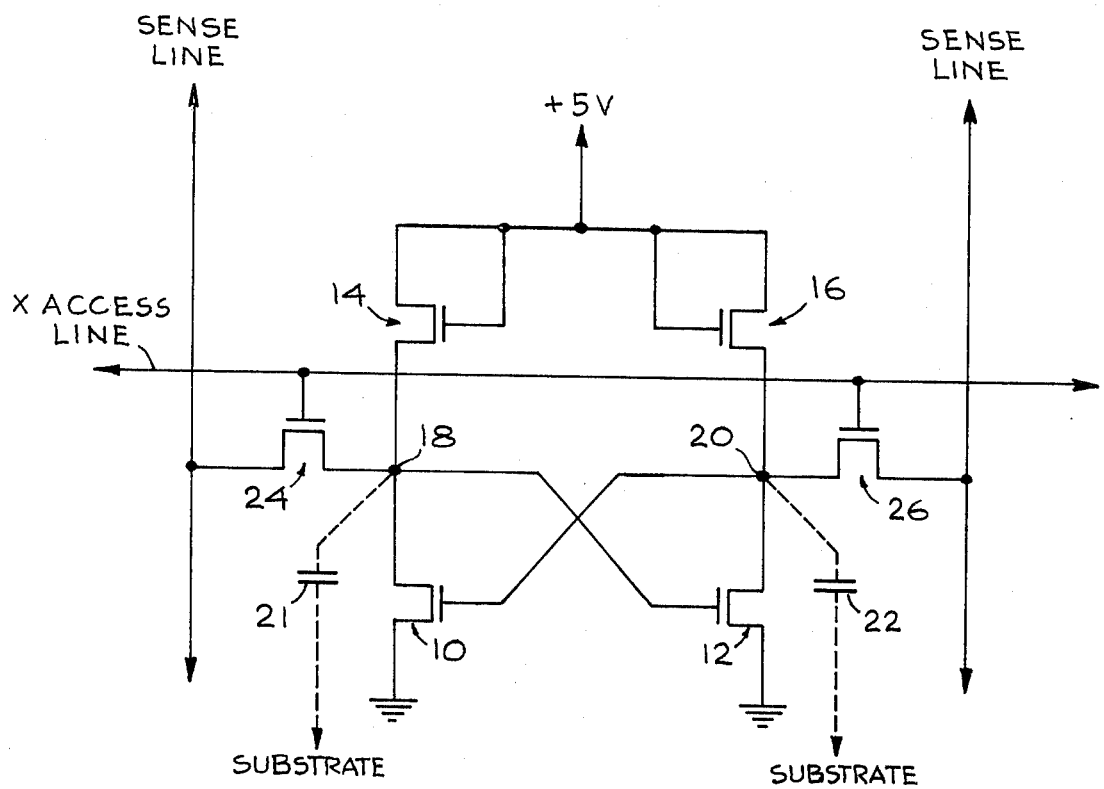

4,004,222

TEST SYSTEM FOR SEMICONDUCTOR MEMORY CELL

BACKGROUND OF THE INVENTION

This invention relates to method and means for testing the storage cells of a static semiconductor memory, and more particularly to improvements therein.

It is customary, in testing static semiconductor memories, to write test patterns and then to read out these test patterns. It has been found that when data is written into the memory and read out immediately thereafter, although the memory passes that test, if an interval of anywhere from 10 to 30 seconds is allowed to elapse before the data is read out again, the memory data will have changed in certain of its storage cells. These are called "delay fails." These delay fails are caused by the load devices used in the memory cell being defective and the reason that this is undetected when an active test such as has been described is conducted is that there is a stray capacitance which exists between the node into which the load device is connected in the memory cell and the substrate, which, over short intervals such as have been indicated, acts to maintain the voltage which would otherwise be supplied to the storage cell through the load device. The stray capacitance is eventually discharged by shunt leakage current.

Since there is always stray capacitance present as a result of the cell construction, unless the effects thereof can be counteracted or minimized, the testing of cells has to proceed at a rather slow pace in order to accurately detect the delay fails which are costly in terms of labor and test throughput.

OBJECTS AND SUMMARY OF THE INVENTION

An object of this invention is the provision of a method and means for increasing the speed of memory testing while enabling the detection of delay fails.

Another object of this invention is the provision of a method and means for minimizing the effects of stray capacitance in the testing of memory cells.

Still another object of the present invention is the provision of an improved and novel method and means for testing semiconductor memory cells.

The foregoing and other objects of the invention are achieved in one method by increasing the temperature of the memory chip to 80° C for example whereby the shunt leakage current is increased to an extent that the waiting period required to accurately test for "delay fails" is reduced considerably. A preferred method for the test however is to test the chip at room temperature while shining light on the chip. This technique also can cause a tremendous increase in the leakage current whereby the test for delay fails can proceed with a minimum of delay before the test.

The novel features of the invention are set forth with particularity in the appended claims. The invention will best be understood from the following description when read in conjunction with the accompanying drawing which illustrates the typical memory cell.

DESCRIPTION OF THE PREFERRED EMBODIMENT

The drawing illustrates a typical known static memory cell and is shown to assist in an understanding of the invention. The memory cell usually comprises a pair of semiconductor devices, 10, 12, typically FETs which are connected together to form a bistable circuit. The loads respectively 14, 16, for the bistable circuits are other semiconductor devices which regulate the current drawn by the bistable circuit from a source, here indicated as 5 volts, for powering the bistable circuit.

From the respective nodes, 18, 20, which are the junctions of the cross coupled semiconductor devices and their loads, there exist stray capacitances, which are represented by the dotted capacitors respectively 21, 22.

The capacitances 21 and 22 existing from the node to the substrate are always present since they are the capacitances of reverse biased drain diffusions to the substrate. The semiconductor devices respectively 24, 26, are also connected to the nodes for the purpose of selecting the data which is stored in the cell.

In the course of testing the memory cells, unless sufficient time is permitted for the stray capacitances to discharge through leakage current to the substrate, the memory cell will preserve the binary bit that was stored therein even if load devices 14, 16 are defective. The leakage current from the stray capacitances is normally on the order of 1 nano ampere so that a considerable period of time must elapse before a capacitance is discharged.

In accordance with this invention, when the memory is packaged or is in such a form so that light cannot be used to illuminate the storage areas thereof, the temperature of the memory is elevated to, for example, a temperature of 80° C. It has been found that the leakage of the stray capacitances 21 and 22 doubles for every 10° C elevation in temperature of the memory. Thus, with the elevated temperature, the memory can be tested in a much shorter period than is otherwise possible and the tests will produce an accurate indication of the acceptable cells.

In the method of testing which is presently used, it is customary to cover the memory undergoing tests with a black cloth to prevent light from illuminating the memory cells.

In accordance with this invention, whenever the cells of the memory can be illuminated, it is preferred to use this technique for causing an increase in the leakage from the stray capacitances that exist. Illumination of a chip from a light source causes a flow of photoelectrons through the semiconductor devices whereby the capacitors 21, 22 are discharged to a level such that they do not interfere with rapid testing of the system. In order to make the testing standard, the level of the light which is employed is raised until a current flow of a hundred microamperes is made to occur through a meter, which may be connected in series with the substrate. The normal substrate current of a memory chip is on the order of one microampere. Accordingly, by increasing the discharge current to a level such as 100 microamperes, for example, the waiting time between the storage of a binary bit in a cell and the readout from that cell for the purpose of testing is decreased 100 times.

There has accordingly been described and shown herein a novel and useful method and means for enabling a much more rapid and accurate test of a semiconductor memory than was heretofore available.

The embodiments of the invention in which an exclusive property or privilege is claimed are defined as follows:

1. In a system wherein a semiconductor memory is tested by writing a test pattern therein, and thereafter reading out the test pattern to determine the ability of the memory to store data, a method of substantially shortening the interval required between writing and reading the test pattern without reducing the accuracy of the test, comprising during a test, substantially increasing the leakage currents of the stray capacitances of the cells of said memory relative to the leakage currents that occur during ambient conditions.

2. A method as recited in claim 1, wherein said step of substantially increasing the leakage currents from the stray capacitances of said memory includes the step of elevating the temperature of said memory, above ambient temperature until the leakage currents are substantially increased.

3. The method as recited in claim 1, wherein said step of increasing the leakage currents from said stray capacitances includes the step of illuminating the storage cells of said memory with the light required to substantially increase the leakage currents from said stray capacitances.

4. A method of increasing the leakage currents as recited in claim 2 wherein said step of elevating the temperature of said memory comprises increasing the temperature of said memory to a temperature on the order of 80° C.

5. A method of increasing the leakage currents from said stray capacitances, as recited in claim 3, wherein the step of illuminating the storage cells of said memory includes, prior to said test, measuring the leakage current of said memory while increasing the light applied to said memory until the leakage current being measured has increased at least 100 times over the ambient leakage current.

6. In a system as recited in claim 1, wherein said leakage currents are increased on the order of 100 times the leakage currents that occur during ambient conditions.

* * * * *